(12) United States Patent
Chen

(10) Patent No.: US 7,709,878 B2
(45) Date of Patent: May 4, 2010

(54) CAPACITOR STRUCTURE HAVING BUTTING CONDUCTIVE LAYER

(75) Inventor: Chung-Chih Chen, Taipei (TW)

(73) Assignee: United Microelectronics Corp., Hsinchu (TW)

( * ) Notice: Subject to any disclaimer, the term of this patent is extended or adjusted under 35 U.S.C. 154(b) by 71 days.

(21) Appl. No.: 11/858,647

(22) Filed: Sep. 20, 2007

(65) Prior Publication Data
US 2009/0079029 A1 Mar. 26, 2009

(51) Int. Cl.
H01L 27/108 (2006.01)
H01L 29/76 (2006.01)
H01L 29/94 (2006.01)
H01L 31/119 (2006.01)

(52) U.S. Cl. ............... 257/301; 257/532; 257/E21.65; 257/E27.092; 257/E29.346

(58) Field of Classification Search ......... 257/296, 257/301, 308, 300, 306, 532, E21.651, E21.647, 257/E21.396, E29.346, E27.092
See application file for complete search history.

(56) References Cited

U.S. PATENT DOCUMENTS

| 6,291,333 | B1 | 9/2001 | Lou |
| 6,329,234 | B1 | 12/2001 | Ma et al. |
| 6,458,706 | B1 | 10/2002 | Chiang et al. |
| 6,765,255 | B2 * | 7/2004 | Jin et al. ............ 257/301 |
| 6,987,059 | B1 | 1/2006 | Burke et al. |
| 7,169,680 | B2 | 1/2007 | Yang et al. |
| 7,169,698 | B2 | 1/2007 | Gambino et al. |
| 7,476,922 | B2 * | 1/2009 | Won et al. .......... 257/301 |
| 2003/0183862 | A1 | 10/2003 | Jin et al. |
| 2005/0266633 | A1 | 12/2005 | Gau |
| 2006/0197088 | A1 * | 9/2006 | Isobe et al. .......... 257/59 |
| 2006/0223276 | A1 | 10/2006 | Lin et al. |

* cited by examiner

Primary Examiner—Davienne Monbleau
Assistant Examiner—Dilinh P Nguyen
(74) Attorney, Agent, or Firm—J.C. Patents

(57) ABSTRACT

A capacitor structure including a substrate, a butting conductive layer, a second dielectric layer, a plurality of openings, a bottom electrode layer, a capacitor dielectric layer, a top electrode layer, and a second metal interconnect layer is provided. The substrate has a first dielectric layer and a first metal interconnect layer located in the first dielectric layer in a non-capacitor region. The butting conductive layer is disposed over the first dielectric layer in a capacitor region. The second dielectric layer is disposed over the first dielectric layer and covers the butting conductive layer. The openings include a first opening exposing a portion of the butting conductive layer and a second opening exposing the first metal interconnect layer. The bottom electrode layer, the capacitor dielectric layer, and the top electrode layer are conformally stacked in the first opening sequentially. The second metal interconnect layer is disposed in the openings.

9 Claims, 3 Drawing Sheets

US 7,709,878 B2

CAPACITOR STRUCTURE HAVING BUTTING CONDUCTIVE LAYER

BACKGROUND OF THE INVENTION

1. Field of the Invention

The present invention relates to a semiconductor device structure and a fabricating method thereof, and more particularly to a capacitor structure and a fabricating method thereof.

2. Description of Related Art

Capacitors are indispensable components in an integrated circuit. In the design and process of the capacitors, capacitance and disposal area of the capacitors must be taken into account. Therefore, it is an important topic in the integrated circuit design to propose a capacitor structure having a high integrity and high capacitance in the current integrated circuit process, so as to increase the effective surface area and improve the capacitor performance when the area occupied by the capacitor is gradually reduced.

FIG. 1 is a cross-sectional view of a conventional capacitor structure.

Referring to FIG. 1, the capacitor structure includes dielectric layers 100, 108, 122, barrier layers 102, 124, metal interconnects 104a, 104b, 126a, 126b, etching stop layers 106, 110, and a capacitor pattern 120. The etching stop layers 106, 110 are respectively disposed between the dielectric layers 100 and 108 and between the dielectric layers 108 and 122. The metal interconnects 104a, 104b are disposed in the dielectric layer 100, and the barrier layer 102 is disposed between the metal interconnects 104a, 104b and the dielectric layer 100. The bottom electrode layer 114, the capacitor dielectric layer 116, and the top electrode layer 118 are disposed in the opening 112 in the dielectric layer 108 sequentially, so as to form a capacitor pattern 120, and the bottom electrode layer 114 is electrically connected to the metal interconnect 104a. The metal interconnect 126a is disposed in the dielectric layer 122, and is electrically connected to the top electrode layer 118 through a barrier layer 124. The metal interconnect 126b is disposed in the dielectric layers 122, 108, and is electrically connected to the metal interconnect 104b through the barrier layer 124. The surface area of the bottom electrode layer 114 and the top electrode layer 118 of the capacitor pattern 120 is increased, thereby increasing the capacitance of the capacitor.

However, in the above conventional capacitor structure, the openings used to form the capacitor pattern 120, metal interconnects 126a and 126b are accomplished by use different photo masks respectively, and the metal interconnect 104a is electrically connected to a bias via other external lead wire design. Therefore, the conventional fabricating method of the capacitor structure is quite complex and more photo masks are used, and thus the manufacturing cost is high.

SUMMARY OF THE INVENTION

Accordingly, the present invention is directed to provide a capacitor structure for effectively increasing the capacitance.

The present invention is also directed to provide a method of fabricating the capacitor structure for reducing the process complexity and manufacturing cost.

The present invention provides a capacitor structure, which includes a substrate, a butting conductive layer, a second dielectric layer, a plurality of openings, a bottom electrode layer, a capacitor dielectric layer, a top electrode layer, and a second metal interconnect layer. The substrate includes a capacitor region and a non-capacitor region and has a first dielectric layer and a first metal interconnect layer located in the first dielectric layer in the non-capacitor region. The butting conductive layer is disposed over the first dielectric layer in the capacitor region. The second dielectric layer is disposed over the first dielectric layer and covers the butting conductive layer. The openings pass through the second dielectric layer, and include a first opening exposing a portion of the butting conductive layer in the capacitor region and a second opening exposing a portion of the first metal interconnect layer in the non-capacitor region. The bottom electrode layer is disposed on an inner wall and a bottom surface of the first opening along a contour of the first opening. The capacitor dielectric layer is conformally disposed on the bottom electrode layer in the first opening. The top electrode layer is conformally disposed on the capacitor dielectric layer in the first opening. The second metal interconnect layer is disposed in the openings and fills the openings.

According to the capacitor structure in the embodiment of the present invention, the openings further include a third opening disposed in the capacitor region and exposing another portion of the butting conductive layer.

According to the capacitor structure in the embodiment of the present invention, the capacitor structure further includes the bottom electrode layer and the top electrode layer disposed on inner walls and bottom surfaces of the second opening and the third opening sequentially from bottom to up.

According to the capacitor structure in the embodiment of the present invention, the capacitor structure further includes a passivation layer disposed between the first dielectric layer and the second dielectric layer and between the first dielectric layer and the butting conductive layer.

According to the capacitor structure in the embodiment of the present invention, a material of the butting conductive layer includes metal.

According to the capacitor structure in the embodiment of the present invention, a top pattern of the first opening includes a round or an oblong shape.

According to the capacitor structure in the embodiment of the present invention, a lower part of the first opening includes a serpentine shape.

According to the capacitor structure in the embodiment of the present invention, a material of the bottom electrode layer is one or more selected from a group consisting of titanium, titanium nitride, tantalum, tantalum nitride, tungsten nitride, tantalum carbide, and tungsten carbide.

According to the capacitor structure in the embodiment of the present invention, the capacitor dielectric layer includes a silicon oxide/silicon nitride/silicon oxide composite layer, a hafnium oxide layer, an aluminum oxide layer, or a hafnium oxide/aluminum oxide composite layer.

According to the capacitor structure in the embodiment of the present invention, a material of the top electrode layer is one or more selected from a group consisting of titanium, titanium nitride, tantalum, tantalum nitride, tungsten nitride, tantalum carbide, and tungsten carbide.

The present invention provides a method of fabricating a capacitor structure, which includes the following steps. First, a substrate including a capacitor region and a non-capacitor region and having a first dielectric layer and a first metal interconnect layer located in the first dielectric layer in the non-capacitor region is provided. Then, a butting conductive layer is formed over the first dielectric layer in the capacitor region. Then, a second dielectric layer is formed over the first dielectric layer and covers the butting conductive layer. Then, a plurality of openings passing through the second dielectric layer is formed. The openings include a first opening exposing a portion of the butting conductive layer and a second opening exposing the first metal interconnect layer. Then, a conformal bottom electrode layer is formed over the substrate. Afterwards, a conformal capacitor dielectric layer is formed on the bottom electrode layer. The conformal capacitor dielectric layer is selectively removed to leave only the capacitor dielectric layer in the first opening. Then, a conformal top electrode layer is formed over the substrate surface. Furthermore, a second metal interconnect layer is formed over the substrate surface to fill the openings.

According to the method of fabricating a capacitor structure in the embodiment of the present invention, the openings further include a third opening exposing another portion of the butting conductive layer.

According to the method of fabricating a capacitor structure in the embodiment of the present invention, the method of fabricating a capacitor structure further includes implementing one or more CMP (chemical mechanical polish) processes to remove the second metal interconnect layer, the top electrode layer and the bottom electrode layer on the substrate surface, but leave these layers in the openings.

According to the method of fabricating a capacitor structure in the embodiment of the present invention, the method of fabricating a capacitor structure further includes forming a passivation layer on the first dielectric layer before the patterned butting conductive layer is formed.

According to the method of fabricating a capacitor structure in the embodiment of the present invention, a forming method of the butting conductive layer includes a physical vapor deposition (PVD) process.

According to the method of fabricating a capacitor structure in the embodiment of the present invention, a forming method of the second dielectric layer includes a chemical vapor deposition (CVD) process.

According to the method of fabricating a capacitor structure in the embodiment of the present invention, a forming method of the bottom electrode layer includes a PVD process, a CVD process, or an atomic layer deposition (ALD) process.

According to the method of fabricating a capacitor structure in the embodiment of the present invention, a forming method of the capacitor dielectric layer includes a CVD process or an ALD process.

According to the method of fabricating a capacitor structure in the embodiment of the present invention, a forming method of the top electrode layer includes a PVD process, a CVD process, or an ALD process.

According to the method of fabricating a capacitor structure in the embodiment of the present invention, a forming method of the second metal interconnect layer includes a plating process.

Based on the above, in the capacitor structure of the present invention, the bottom electrode layer and the top electrode layer are formed on the inner wall and the bottom surface of the first opening, so the effective surface area of a vertical portion is increased, thereby improving the capacitance effectively. Moreover, the capacitor structure of the present invention has a butting conductive layer, thereby increasing the flexibility of the design and process.

On the other hand, in the method of fabricating a capacitor structure of the present invention, the first opening in the capacitor region and the second opening in the non-capacitor region are formed by using the same photo mask, and the second metal interconnect layer in the opening is formed at the same time, thereby effectively reducing the process complexity and manufacturing cost.

Furthermore, when the third opening is formed, the bottom electrode layer may be connected to a bias through the butting conductive layer and the second metal interconnect layer formed in the third opening, thereby further simplify the process.

In order to make the aforementioned and other objectives, features and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

FIGS. 2A to 2D are cross-sectional views of processes of fabricating a memory structure according to an embodiment of the present invention.

Figure 1:
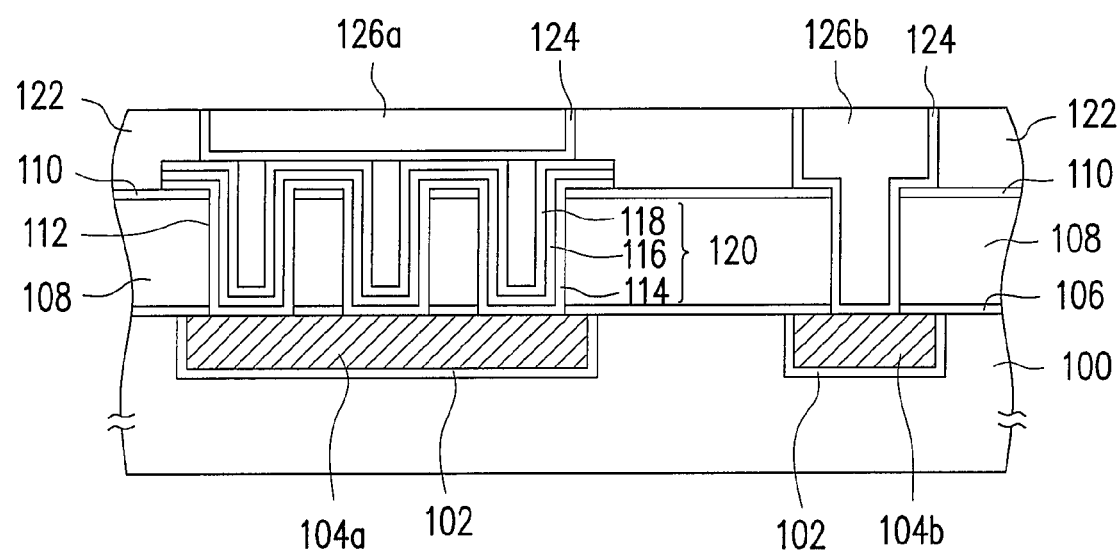
FIG. 1 is a cross-sectional view of a conventional capacitor structure.
Figure 2A:
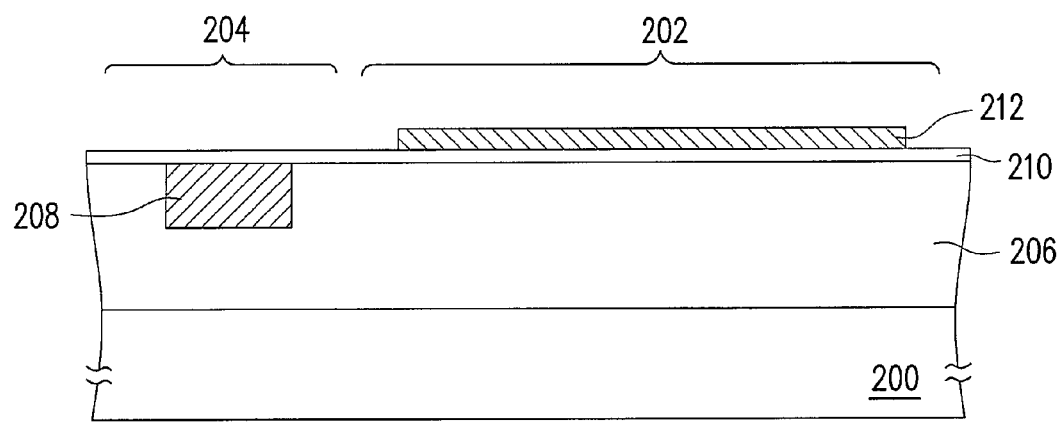
FIGS. 2A to 2D are cross-sectional views of processes of fabricating a memory structure according to an embodiment of the present invention.

First, referring to FIG. 2A, a substrate 200 is provided, which includes a capacitor region 202 and a non-capacitor region 204 and has a dielectric layer 206 and a metal interconnect layer 208. The metal interconnect layer 208 is located in the dielectric layer 206 in the non-capacitor region 204. The material of the dielectric layer 206 is, for example, silicon oxide, and depending on the etch, lithography processes and device speed requirements, the material of the dielectric layer 206 may be low-k material, anti-reflective coating material, etch hard mask material or a combination of different dielectric materials. A forming method of the dielectric layer 206 is, for example, a chemical vapor deposition (CVD) process. The material of the metal interconnect layer 208 is, for example, metal, such as copper. A forming method of the metal interconnect layer 208 is, for example, a metal damascene process.

Afterwards, a passivation layer 210 is optionally formed on the dielectric layer 206. The material of the passivation layer 210 is, for example, silicon nitride. A forming method of the passivation layer 210 is, for example, a CVD process.

Then, a butting conductive layer 212 is formed over the dielectric layer 206 in the capacitor region 202, for connecting the bottom electrode in the capacitor structure to a first bias. The material of the butting conductive layer 212 is, for example, metal, such as aluminum. A forming method of the butting conductive layer 212 includes, for example, forming a butting conductive material layer through a physical vapor deposition (PVD) process, and then performing a patterning process on the butting conductive material layer.

Figure 2B:
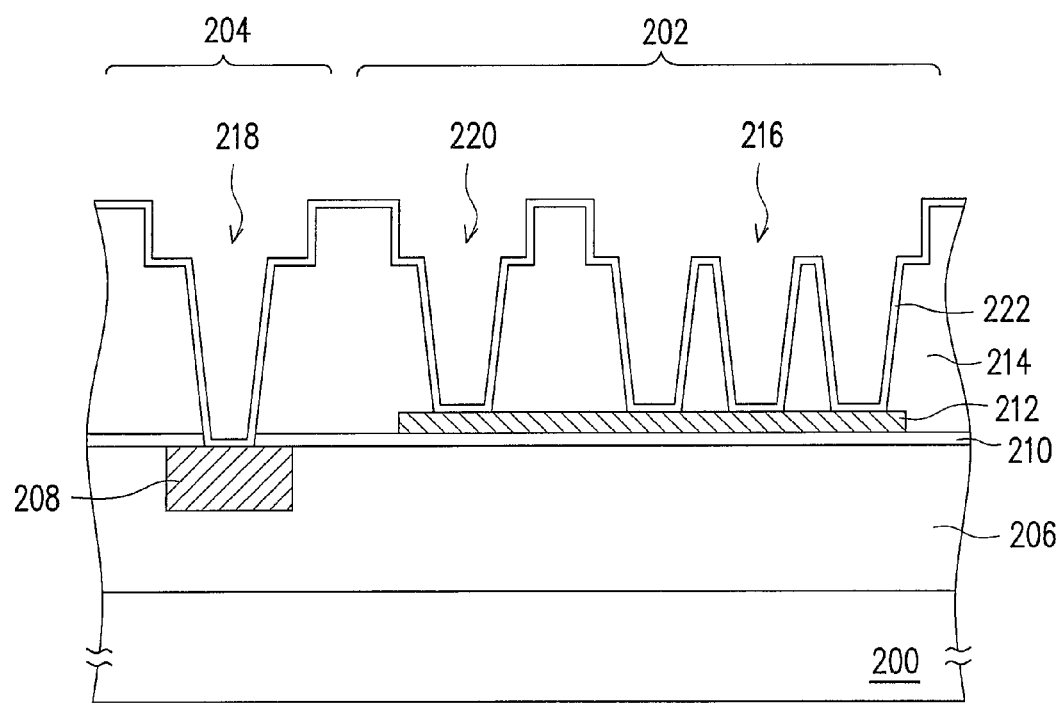

Then, referring to FIG. 2B, a dielectric layer 214 is formed over the dielectric layer 206 and covers the butting conductive layer 212. The material of the dielectric layer 214 is, for example, silicon oxide, and depending on the etch, lithography processes and device speed requirements, the material of the dielectric layer 214 may be low-k material, anti-reflective coating material, etch hard mask material or a combination of different dielectric materials. A forming method of the dielectric layer 214 is, for example, a CVD process.

Then, openings 216 and 218 passing through the dielectric layer 214 are formed. The opening 216 exposes a portion of the butting conductive layer 212 so as to define the pattern of the capacitor in the capacitor region 202. The top pattern of the opening 216, for example, has a round or an oblong shape, and the lower part of the opening 216, for example, has a serpentine shape. The opening 218 passes through the dielectric layer 214 and the passivation layer 210, and exposes a portion of the metal interconnect layer 208, so as to define the pattern of the metal interconnect in the non-capacitor region 204. Moreover, when the openings 216 and 218 are formed, an opening 220 may be formed for exposing another portion of the butting conductive layer 212, so as to define the pattern of the external lead wire of the capacitor. It should be noted that persons of ordinary skill in the art can adjust the top pattern and shape of the openings 216, 218, 220 freely. The forming method of the openings 216, 218, 220 is a simple combination of conventional lithography process and etching process such as the opening-forming process of single or dual damascene, so it will not be repeated herein.

Afterwards, a conformal bottom electrode layer 222 is formed on the inner wall and bottom surface of the opening 216, and is electrically connected to the butting conductive layer 212. The material of the bottom electrode layer 222 is, for example, one or more selected from a group consisting of titanium, titanium nitride, tantalum, tantalum nitride, tungsten nitride, tantalum carbide, and tungsten carbide. The forming method of the bottom electrode layer 222 is, for example, a PVD process, a CVD process, or an atomic layer deposition (ALD) process. Moreover, the bottom electrode layer 222 is also formed in the openings 218, 220 while being formed in the opening 216, and is electrically connected to the metal interconnect layer 208 and the butting conductive layer 212 respectively.

Figure 2C:
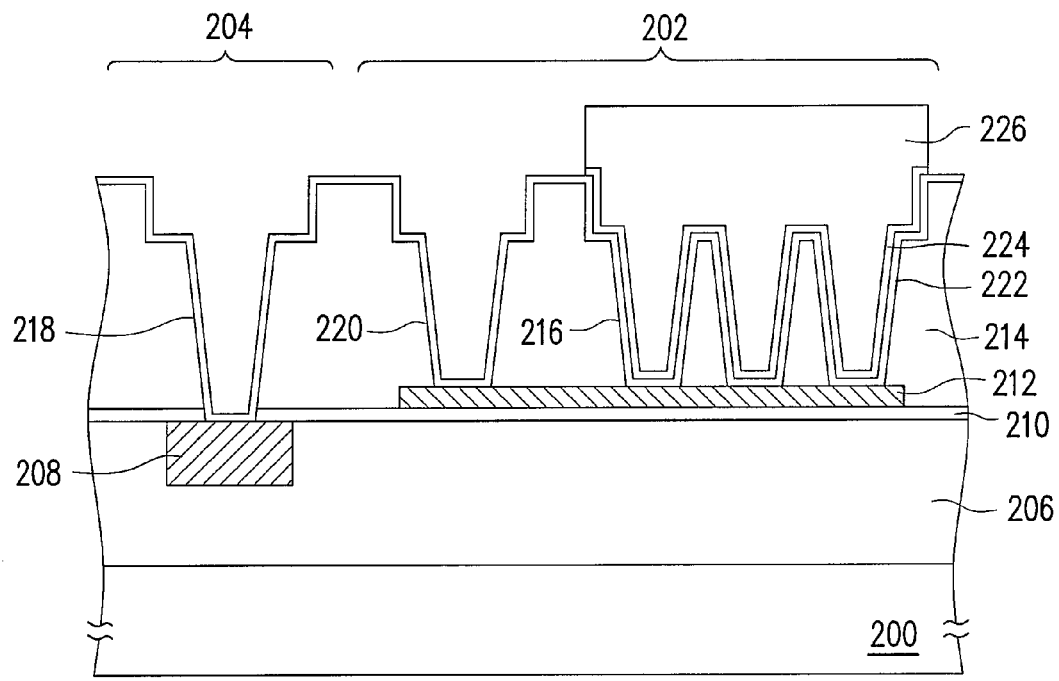

Next, referring to FIG. 2C, a conformal capacitor dielectric layer 224 is formed on the bottom electrode layer 222. The capacitor dielectric layer 224 is, for example, a silicon oxide/silicon nitride/silicon oxide composite layer, a hafnium oxide layer, an aluminum oxide layer, or a hafnium oxide/aluminum oxide composite layer. The forming method of the capacitor dielectric layer 224 is, for example, a CVD process or an ALD process.

Then, a patterned photoresist layer 226 is formed over the substrate 200 to cover the capacitor dielectric layer 224 in the opening 216. The forming method of the patterned photoresist layer 226 is, for example, a lithography process.

After that, the part of the capacitor dielectric layer 224 located outside the opening 216 is removed. The method for removing a part of the capacitor dielectric layer 224 is, for example, a dry etching or wet etching process.

Figure 2D:
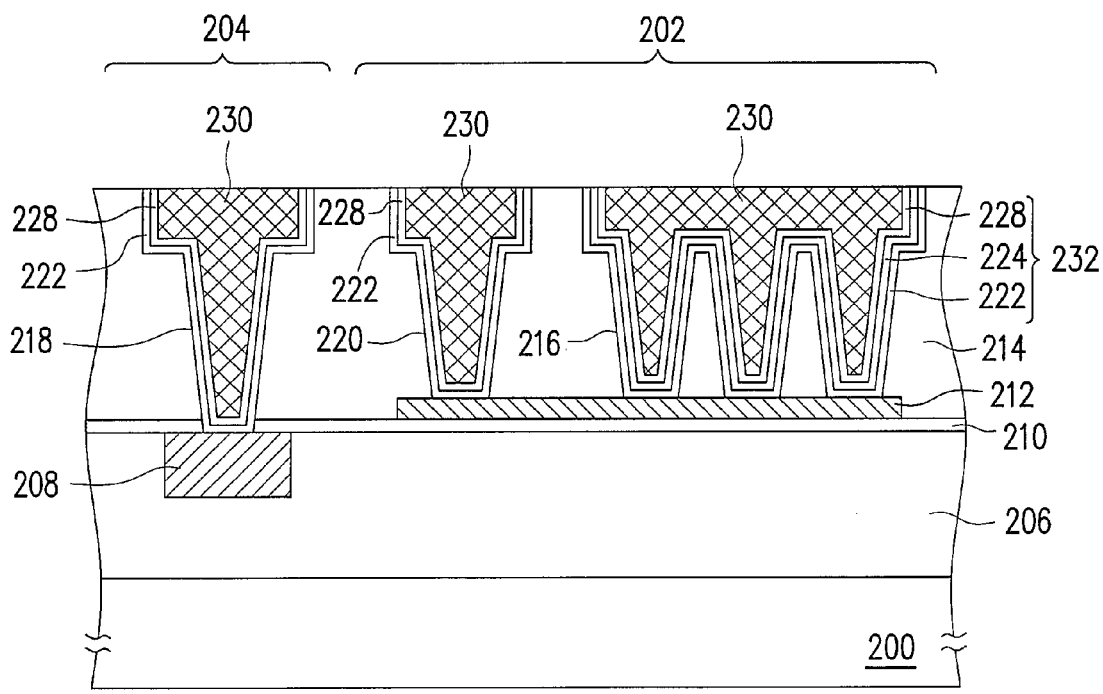

Then, referring to FIG. 2D, the patterned photoresist layer 226 is removed. The method for removing the patterned photoresist layer 226 is for example an ashing process.

Then, a conformal top electrode layer 228 is formed over the substrate 200. The material of the top electrode layer 228 is, for example, one or more selected from the group consisting of titanium, titanium nitride, tantalum, tantalum nitride, tungsten nitride, tantalum carbide, and tungsten carbide. The forming method of the top electrode layer 228 is, for example, a PVD process, a CVD process, or an ALD process. Moreover, the top electrode layer 228 is formed on the bottom electrode 222 of the openings 218, 220 at the same time, and electrically connected to the bottom electrode 222 in the openings 218, 220. The bottom electrode layer 222 and the top electrode layer 228 may not only be used as the bottom electrode and the upper electrode of the capacitor structure, but may also be used as a barrier layer and an adhesion layer at the same time after a selection of the material.

Furthermore, a metal interconnect layer 230 is formed over the substrate 200 surface, for example by a plating process, to fill the openings 216, 218, 220. In the opening 216, the metal interconnect layer 230 is electrically connected to the top electrode layer 228, so as to connect the top electrode layer 228 of the capacitor structure to a second bias. In the opening 218, the metal interconnect layer 230 is electrically connected to the top electrode layer 228, and is electrically connected to the metal interconnect layer 208 through the bottom electrode layer 222. In the opening 220, the metal interconnect layer 230 is electrically connected to the top electrode layer 228, and electrically connected to the butting conductive layer 212 through the bottom electrode layer 222, so as to connect the bottom electrode layer 228 of the capacitor structure to a first bias. The material of the metal interconnect layer 230 is, for example, metal, such as copper. The forming method of the metal interconnect layer 230 is, for example, a metal damascene process. The metal damascene process includes, for example, first depositing a metal material layer (not shown) on the substrate 200, and then using the dielectric layer 214 as a polish stop layer to remove the metal material layer out of the openings 216, 218, 220 through a chemical mechanical polishing (CMP) process.

Moreover, in this embodiment, the top electrode layer 228 and the bottom electrode layer 222 outside the openings 216, 218, 220 are removed, such that the top electrode layer 228 and the bottom electrode layer 222 in the openings 216, 218, 220 are electrically insulated from each other. The bottom electrode layer 222, the capacitor dielectric layer 224, and the top electrode layer 228 in the opening 216 constitute a capacitor pattern 232. In this embodiment, the method for removing the top electrode layer 228 and the bottom electrode layer 222 outside the openings 216, 218, 220 includes removing the top electrode layer 228 and the bottom electrode layer 222 outside the openings 216, 218, 220 through a CMP process in the metal damascene process of forming the metal interconnect layer 230, which will not limit the present invention.

Based on the above embodiments, the openings 216, 220 in the capacitor region 202 and the opening 218 in the non-capacitor region 204 are formed in the same mask process. The metal interconnect layers 230 in the openings 216, 218, 220 is formed at the same time, thereby effectively reducing the process complexity and manufacturing cost.

Moreover, when the opening 220 is formed, the bottom electrode layer 222 may be connected to a first bias by the butting conductive layer 212 and the metal interconnect layer 230 formed in the opening 220, thereby further simplifying the process.

Hereinafter, the capacitor structure of this embodiment will be illustrated with reference to FIG. 2D.

Referring to FIG. 2D, the capacitor structure includes a substrate 200, a passivation layer 210, a butting conductive layer 212, a dielectric layer 214, openings 216, 218, 220, a bottom electrode layer 222, a capacitor dielectric layer 224, a top electrode layer 228, and a metal interconnect layer 230. The substrate 200 includes a capacitor region 202 and a non-capacitor region 204, and has a dielectric layer 206 and a metal interconnect layer 208. The metal interconnect layer 208 is located in the dielectric layer 206 in the non-capacitor region 204. The buffing conductive layer 212 is disposed over the dielectric layer 206 in the capacitor region 202. The passivation layer 210 is disposed between the dielectric layer 206 and the dielectric layer 214 and between the dielectric layer 206 and the butting conductive layer 212. The dielectric layer 214 is disposed over the dielectric layer 206 and covers the butting conductive layer 212. The opening 216 exposes a portion of the butting conductive layer 212, the opening 218 exposes a portion of the metal interconnect layer 208, and the opening 220 exposes another portion of the butting conductive layer 212. In the opening 216, the conformal bottom electrode layer 222 is disposed on the inner wall and the bottom surface of the opening 216 along the contour of the opening 216, the conformal capacitor dielectric layer 224 is disposed on the bottom electrode layer 222, and the conformal top electrode layer 228 is disposed on the capacitor dielectric layer 224. The top electrode layer 228, the capacitor dielectric layer 224, and the bottom electrode layer 222 constitute a capacitor pattern 232. In the openings 218, 220, the conformal bottom electrode layer 222 is disposed on the inner walls and the bottom surfaces of the openings 218, 220 along the contour of the openings 218, 220, and the conformal top electrode layer 228 is disposed on the bottom electrode layer 222. The metal interconnect layer 230 is disposed on the top electrode layer 228 in the openings 216, 218, 220 and fills the openings 216, 218, 220. The material, forming method, and effect of all the components in the capacitor structure have been illustrated above in detail, and will not be repeated herein.

Based on the above, the bottom electrode layer 222 and the top electrode layer 228 of the capacitor pattern 232 are also formed on the inner walls of the opening 216, such that the surface area of the vertical portion can be increased, thereby effectively increasing the capacitance. Moreover, when the lower part of the opening 216 has a serpentine shape, the surface area of the bottom electrode layer 222 and the top electrode layer 228 may be further increased, thereby increasing the capacitance.

Furthermore, the butting conductive layer 212 in the capacitor structure may increase the flexibility of design and process, thereby reducing the process complexity.

To sum up, in the capacitor structure of the present invention, the surface area of vertical portions of the bottom electrode layer and the top electrode layer are increased, thereby improving the capacitance effectively.

Moreover, the capacitor structure of the present invention has a butting conductive layer, thereby increasing the flexibility of the design and process.

On the other hand, the method of fabricating a capacitor structure of the present invention could reduce the number of the photo masks, thereby effectively reducing the process complexity and manufacturing cost.

Though the present invention has been disclosed above by the preferred embodiments, they are not intended to limit the present invention. Anybody skilled in the art can make some modifications and variations without departing from the spirit and scope of the present invention. Therefore, the protecting range of the present invention falls in the appended claims and their equivalents.

What is claimed is:

1. A capacitor structure, comprising:
a substrate, comprising a capacitor region and a non-capacitor region, and having a first dielectric layer and a first metal interconnect layer located in the first dielectric layer in the non-capacitor region;
a butting conductive layer, disposed over the first dielectric layer in the capacitor region;
a second dielectric layer, disposed over the first dielectric layer and covering the butting conductive layer;
a plurality of openings, passing through the second dielectric layer, and comprising:
a first opening, exposing a portion of the butting conductive layer in the capacitor region;
a second opening, exposing a portion of the first metal interconnect layer in the non-capacitor region; and
a third opening, exposing another portion of the butting conductive layer in the capacitor region;
a bottom electrode layer, disposed on an inner walls and a bottom surface of the first opening along a contour of the first opening;
a capacitor dielectric layer, conformally disposed on the bottom electrode layer in the first opening;
a top electrode layer, conformally disposed on the capacitor dielectric layer in the first opening; and
a second metal interconnect layer, disposed in the openings and filling the openings, wherein the second metal interconnect layer in the first opening and the second metal interconnect layer in the third opening are disconnected, and there is no dielectric layer between the butting conductive layer and the second metal interconnect layer located in the third opening.

2. The capacitor structure as claimed in claim 1, further comprising the bottom electrode layer and the top electrode layer disposed on inner walls and bottom surfaces of the second opening and the third opening sequentially from bottom to up.

3. The capacitor structure as claimed in claim 1, further comprising a passivation layer disposed between the first dielectric layer and the second dielectric layer and between the first dielectric layer and the butting conductive layer.

4. The capacitor structure as claimed in claim 1, wherein a material of the butting conductive layer comprises metal.

5. The capacitor structure as claimed in claim 1, wherein a top pattern of the first opening comprises a round or an oblong shape.

6. The capacitor structure as claimed in claim 1, wherein a lower part of the first opening comprises serpentine shape.

7. The capacitor structure as claimed in claim 1, wherein a material of the bottom electrode layer is one or more selected from a group consisting of titanium, titanium nitride, tantalum, tantalum nitride, tungsten nitride, tantalum carbide, and tungsten carbide.

8. The capacitor structure as claimed in claim 1, wherein the capacitor dielectric layer comprises a silicon oxide/silicon nitride/silicon oxide composite layer, a hafnium oxide layer, an aluminum oxide layer, or a hafnium oxide/aluminum oxide composite layer.

9. The capacitor structure as claimed in claim 1, wherein a material of the top electrode layer is one or more selected from a group consisting of titanium, titanium nitride, tantalum, tantalum nitride, tungsten nitride, tantalum carbide, and tungsten carbide.

* * * * *